United States Patent [19]
Watanabe

[11] Patent Number: 4,775,809
[45] Date of Patent: Oct. 4, 1988

[54] OUTPUT BUFFER CIRCUIT AVOIDING ELECTROSTATIC BREAKDOWN

[75] Inventor: Kazuo Watanabe, Kanagawa, Japan

[73] Assignee: Sony Corporation, Tokyo, Japan

[21] Appl. No.: 56,103

[22] Filed: Jun. 1, 1987

[30] Foreign Application Priority Data

Jun. 3, 1986 [JP] Japan .................. 61-128586

[51] Int. Cl.⁴ ............... H03K 19/017; H03K 19/094; H03K 17/687
[52] U.S. Cl. ........................... 307/448; 307/200 B; 307/450; 307/451; 307/530; 307/572
[58] Field of Search ................. 307/200 B, 443, 448, 307/450-451, 342, 357, 530, 550, 551, 567-568, 572

[56] References Cited

U.S. PATENT DOCUMENTS

| 4,459,494 | 7/1984 | Takakura | 307/448 |
| 4,687,955 | 8/1987 | Koinuma | 307/448 |

FOREIGN PATENT DOCUMENTS

0217525 4/1987 European Pat. Off. .

OTHER PUBLICATIONS

IBM Tech. Disc. Bul., "Power Dissipation Reduction Logic Circuitry", McCullough.
IEEE Journal of Solid State Circuits, "BiMOS Micropower IC's".
"Optimized ESD Protection Circuits for High Speed MOS/VLSI by Fujishin et al., 1985 IEEE Journal of Solid-State Circuits SC-20 Apr., No. 2, pp. 594-596.
Japanese Abstract application 59-78561, vol. 10, No. 79, E-391, 2136 of Mar. 28, 1986.
Japanese Abstract No. 58-119079, vol. 9, No1 123, E-317, 1846, May 28, 1985.

*Primary Examiner*—John S. Heyman
*Assistant Examiner*—M. R. Wambach
*Attorney, Agent, or Firm*—Hill, Van Santen, Steadman & Simpson

[57] ABSTRACT

This invention relates to an output buffer circuit that improves the electrostatic sustenance. In the circuit construction of the present invention there are provided dummy MOS transistors that are connected to an output terminal in parallel with the standard MOS transistors for an output buffer, and which are not connected to an input terminal. Due to circuit construction, the dummy transistors increase the capacity of the buffer circuit and an output buffer circuit which has high electrostatic breakdown can be obtained.

2 Claims, 2 Drawing Sheets

OUTPUT BUFFER CIRCUIT AVOIDING ELECTROSTATIC BREAKDOWN

BACKGROUND OF THE INVENTION

1. Field of the Invention

This invention relates in general to an output buffer circuit which is utilized in semiconductor devices such as memory devices.

2. Description of the Prior Art

Prior art output buffer circuits are such as illustrated in FIG. 3 wherein a driver 32 is connected to an output terminal of a sense amplifier 31 that receives at its input the output of memory cells in which information signals are stored and whereby readout signals corresponding to the address signals are sensed. The driver 32 is connected to an input terminal 33 of an output buffer circuit. The output buffer circuit comprises a PMOS transistor 34 and a NMOS transistor 35. The input terminal 33 is connected to the gates of both of the PMOS transistor 34 and the NMOS transistor 35. The source of the PMOS transistor 34 is connected to a suitable power supply voltage and the source of the NMOS transistor 35 is connected to a ground voltage. The drains of the transistors 34 and 35 are connected together and to an output terminal 36.

In the prior art, since each MOS transistors 34 and 35 has the function to serve as an electrostatic protective circuit, it is not necessary to provide a special protective circuit. FIG. 2 illustrates a MOS transistor which has a depletion layer 23 formed in a PN junction 22 formed in an impurity region 21 on the drain D during reverse bias and the MOS transistor itself serves as a protective diode such that breakdown is caused at lower voltage than the electrostatic breakdown voltage on an adjacent part to the surface on the channel side of the PN junction 22 and electrostatic breakdown will be avoided.

However, due to the miniaturization of memory devices, the channel width W of the MOS transistor in the output buffer circuit will become narrower and narrower. As shown in FIG. 4 by the dotted line when the channel width W becomes narrower, the breakdown voltage increases so that it is not possible to protect the output buffer circuit effectively from electrostatic breakdown.

Thus, when the channel width W becomes narrower, the volume of the substrate 24 that encloses the PN junction 22 or the well region 25 becomes relatively larger and as a result, the voltage applied to the depletion layer 23 will be reduced due to the resistance change. Thus, at a particular voltage insulation breakdown occurs instead. Also, the narrow channel width W causes more current to be supplied per unit area which causes electrostatic breakdown to occur at lower voltages.

The breakdown voltage does not increase if the channel width W does not become narrower.

However, unless the channel width W becomes narrower, the ability of the output buffer to drive becomes larger than is desired. If excess current flows when the load capacity 37 is driven, as shown in FIG. 3, harmful influences occur to the power supply voltage or to the ground voltage due to parasitic inductances which may occur and which may cause malfunctions of the circuit.

If on the other hand, the channel length L of the MOS transistor of the output buffer circuit is set to be longer than that of the MOS transistor such as in the memory cells, the channel width W need not be narrowed and the driving ability of the output buffer can be maintained within the desired range.

In such a case, however, the gate capacity which depends on the area of the gate electrode G illustrated in FIG. 2 of MOS transistors 34 and 35 of the output buffer circuit increases as illustrated in solid line in FIG. 4. This may cause undesirable effects such as delay in the operating speed, increased power consumption or undesirable pattern area effects and may result in the necessity to improve the driving ability of the driver 32 in the sense amplifier 32.

SUMMARY OF THE INVENTION

It is therefore, an object of the present invention to provide an output buffer circuit that effectively avoids the electrostatic breakdown in case the channel width W is made narrower.

The foregoing object is accomplished in one embodiment of the invention by providing an output buffer circuit wherein MOS transistors are connected in parallel with the MOS transistors for the output buffer and which are connected to an output terminal without being connected to the input terminal.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

In the present invention additional MOS transistors are connected to the output terminal in parallel with the conventional MOS transistors for the output buffer. The additional MOS transistors which are connected to the output terminal have the function to serve as diodes relative to the output and, thus, when the channel width W is set to be narrower, a characteristic can be obtained which is similar to that when the channel width W remains wide.

Figure 4:
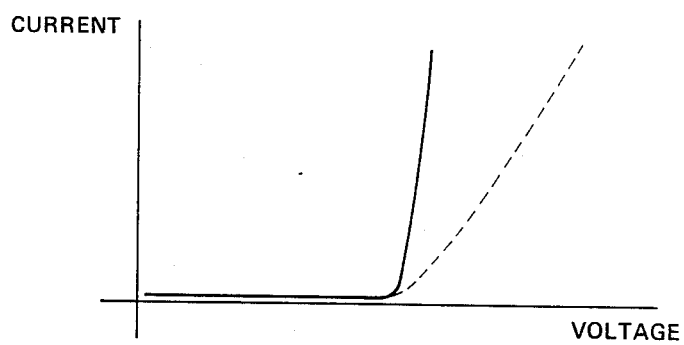
FIG. 4 is a graph illustrating the breakdown characteristics.

For example, due to the static electricity electrical charges will flow from the output terminal which result in a voltage being applied to the output terminal. Also, that voltage is applied not only to the PN junction of the impurity region in the MOS transistor for the output buffer, but also to the PN junction of the impurity region which is connected to the output terminal of the MOS transistor that has the function of a protective diode. As the region where the voltage is applied increases, the resistance becomes relatively small and when the resistance reaches a small enough value, a breakdown at a proper voltage without contribution of the resistance in caused as is shown by the solid line in FIG. 4 so as to avoid early insulation breakdown. Also, since the region where the current flows increases, the current density is substantially reduced so that electrostatic breakdown will be avoided.

Figure 1:
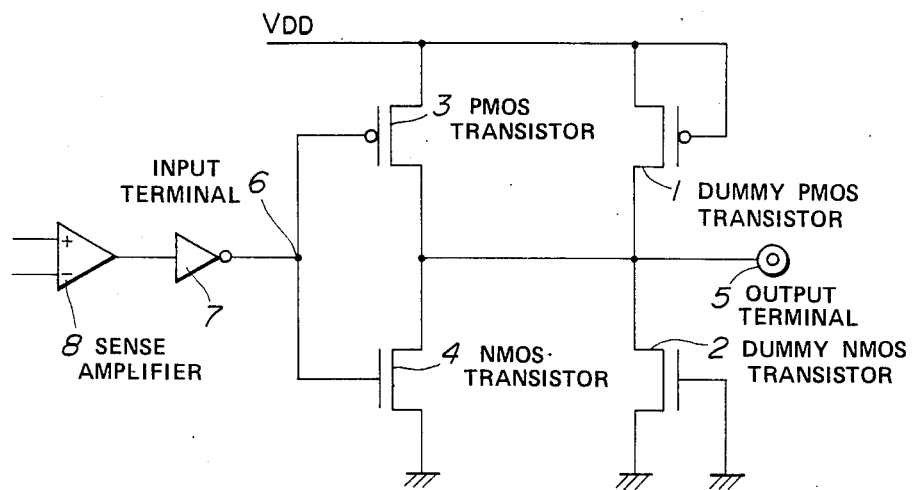
FIG. 1 is a circuit diagram illustrating the example of an output buffer circuit according to the invention.
Figure 2:
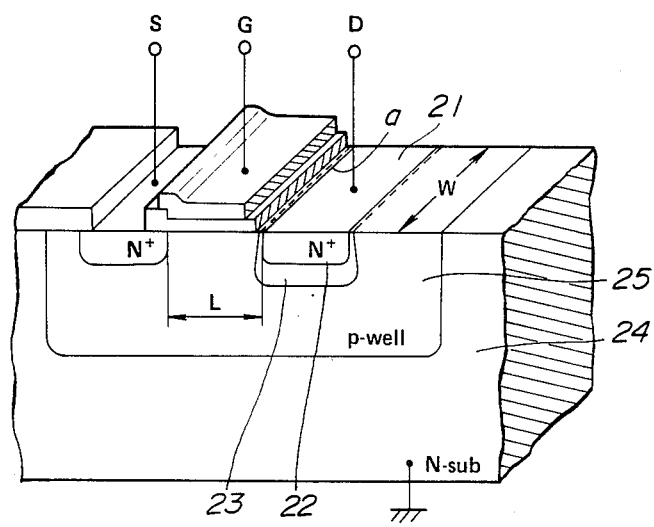
FIG. 2 is an enlarged perspective view with certain parts shown in cross-section showing an ordinary MOS transistor.
Figure 3:
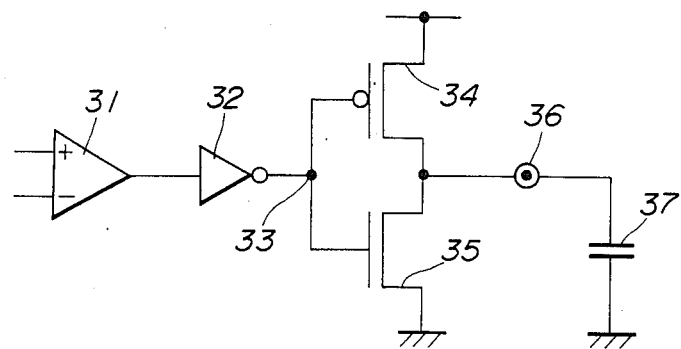
FIG. 3 is a circuit diagram illustrating the conventional output buffer circuit.

A preferred embodiment of the invention is illustrated in FIG. 1 and the present invention is an output buffer circuit in memory devices in which the information signals are stored and which circuit consists of CMOS transistors.

As is illustrated in FIG. 1, in the output buffer circuit, the sense amplifier 8 is connected to the driver 7 which is connected to an input terminal 6. The input terminal 6 is connected to the gate of a PMOS transistor 3 and to the gate of a NMOS transistor 4 and both of these transistors will be MOS transistors for the output buffer. The source of the PMOS transistor 3 is connected to a power supply level $V_{DD}$ and the source of the NMOS transistor 4 is connected to ground. A dummy PMOS transistor 1 which functions to serve as a protective diode is connected in parallel with the PMOS transistor 3 and has its source connected to the voltage $V_{DD}$. A dummy NMOS transistor 2 is connected in parallel with the transistor 4 and has its source connected to ground and it will function as a protective diode. The drains of the transistors 1 and 2 are connected together and to the output terminal 5 as are the drains of the transistors 3 and 4. The gate of transistor 1 is connected to its source and the gate of transistor 2 is connected to its source.

The sense amplifier 8 senses small information signals from the capacitor of the respective memory cells devices and outputs the level which is read through the driver 7 to the input terminal 6 of transistors 3 and 4. The driver 7 amplifies the input signals and the output signal from the driver 7 is supplied as an input to the main output buffer circuit and during actuation an output is produced from the CMOS output stage of the PMOS transistor 3 and the NMOS transistor 4 which is furnished to output terminal 5.

In the output buffer circuit of the present embodiment which have the above described circuit construction, in addition to the PMOS transistor 3 and the NMOS transistor 4 which are used to drive the load with the signal which corresponds to the input signals, the dummy PMOS transistor 1 and the dummy NMOS transistor 2 are added and are used as protective diodes and are connected to the output terminal 5 as shown. Thus, in case the channel width W of the PMOS transistor 3 and the NMOS transistor 4 become narrower during operations a favorable breakdown characteristic can be maintained and also the electrostatic protective function will be improved over structures of the prior art.

For instance, in case static electricity, for example, flows into the circuit from the output terminal 5, a voltage is applied not only to the impurity region which is connected to the output terminal 5 of PMOS transistor 3 and NMOS transistor 4, but a voltage will also be applied to the respective PN junctions of the impurity regions which is connected to the output terminal 5 of dummy PMOS transistor 1 and dummy NMOS transistor 2. This means that the regions which act as diodes relative to the output has been increased. Since the resistance of the substrate or the well, for example, is relatively reduced as described above, favorable breakdown characteristics can be obtained without widening the channel width W of the MOS transistor of the output buffer.

Since the output buffer circuit of the present embodiment consists of CMOS transistors, a breakdown will be caused in the NMOS transistor which has a PN junction which is biased in the reverse direction by excess voltages with ± electrical charges, respectively.

In addition, in the output buffer circuit of the above described construction, there will be applied a constant potential to gates of the dummy PMOS transistor 1 and NMOS transistor 2, respectively, and these dummy transistors will not be utilized when the output buffer circuit is in operation. This fact causes the realization that, the circuit can be designed without considering the electrostatic sustenance, and the dummy PMOS transistor 1 and the dummy NMOS transistor 2 can be added after the optional channel width W and the channel length L have been fixed. Thus, the output buffer circuit of the present invention simplifies the design of circuits as well in improving the electrostatic sustenance.

Although the present embodiment has been described as an output buffer circuit with reference to CMOS transistors, it is to be realized that the invention can be applied to other embodiments and modifications.

It is possible with the output buffer circuit of the present invention to obtain favorable breakdown characteristics without decreasing the channel width W and the channel length L and, thus, the electrostatic sustenance can be improved. Also, the MOS transistor which is connected to the output terminal is not employed during normal driving operation so when the circuit is designed, the electrostatic sustenance can be improved by providing the dummy MOS transistors. Also, since the channel width W and the channel length L are effectively provided, the noise characteristics, the operating speed, the power consumption characteristic and the pattern area can be effectively improved.

Although the illustrated embodiment of the invention has been described in detail with reference to the accompanying drawings, it is to be understood that the invention is not limited to the precise embodiment illustrated and that various changes and modifications may be effected by one skilled in the art without departing from the scope or spirit of the invention as defined in the appended claims.

I claim as my invention:

1. A circuit comprising, an input terminal, a first PMOS transistor which has a source, drain and gate and its gate connected to said input terminal, a first NMOS transistor which has a source, drain and gate and its gate connected to said input terminal, a voltage source connected to the source of said first PMOS transistor, a reference potential connected to the source of said first NMOS transistor, a second PMOS transistor which has a source, drain and gate and its source and drain connected together and the combination connected to said voltage source, a second NMOS transistor which has a source, drain and gate and its source and gate connected together and to said reference potential, and an output terminal connected to the drains of said first and second PMOS transistors and to the drains of said first and second NMOS transistors.

2. A circuit according to claim 1 including a sense amplifier which receives at its input signals from memory cell devices and supplies its output to said input terminal.

* * * * *

UNITED STATES PATENT AND TRADEMARK OFFICE
CERTIFICATE OF CORRECTION

PATENT NO. : 4,775,809
DATED : October 4, 1988
INVENTOR(S) : Kazuo Watanabe

It is certified that error appears in the above-indentified patent and that said Letters Patent is hereby corrected as shown below:

Col. 4, line 55, change "drain", second occurrence to "gate".

Signed and Sealed this

Fourth Day of August, 1998

Attest:

Attesting Officer

BRUCE LEHMAN

*Commissioner of Patents and Trademarks*